United States Patent [19]

Miyake et al.

[11] Patent Number: 5,399,889
[45] Date of Patent: Mar. 21, 1995

[54] IMAGE SENSOR PROVIDING OUTPUT IMAGE SIGNAL WITH REDUCED OFFSET

[75] Inventors: Hiroyuki Miyake; Tsutomu Abe, both of Kanagawa, Japan

[73] Assignee: Fuji Xerox Co., Ltd., Tokyo, Japan

[21] Appl. No.: 64,577

[22] Filed: May 21, 1993

[30] Foreign Application Priority Data

May 22, 1992 [JP] Japan .................................. 4-154072

[51] Int. Cl.⁶ ..................... H01L 27/14; H01L 31/00
[52] U.S. Cl. .................................. 257/292; 257/350; 257/354; 257/448; 257/459; 257/461; 250/370.08; 250/370.14
[58] Field of Search ......................... 257/53, 59, 61, 72, 257/231, 233, 234, 292, 443, 448, 459, 461, 350, 352, 353, 354; 250/370.08, 370.14

[56] References Cited

U.S. PATENT DOCUMENTS

| | | | |
|---|---|---|---|
| 5,196,721 | 3/1993 | Miyake et al. | 257/292 |
| 5,196,912 | 3/1993 | Matsumoto et al. | 257/352 |
| 5,202,575 | 4/1993 | Sakai | 257/292 |

FOREIGN PATENT DOCUMENTS

61-255176 11/1986 Japan .
64-5159 1/1989 Japan .
2-260968 10/1990 Japan .
2-265362 10/1990 Japan .

Primary Examiner—Ngân V. Ngô
Attorney, Agent, or Firm—Finnegan, Henderson, Farabow, Garrett & Dunner

[57] ABSTRACT

An image sensor comprises photo sensing elements, having charge storage capability, for transducing received light into electrical quantities. First switching elements have charge storage capability for transferring the charge stored in the photo sensing elements. Second switching elements have charge storage capability for resetting the photo sensing elements by removing the charge still left in the photo sensing elements after the charge transfer. The image sensor further comprises a first gate pulse generator for generating a first pulse signal to be applied to the first switching elements, and a second gate pulse generator for generating a second pulse signal to be applied to the second switching elements, the amplitude of the second pulse signal being different from that of the first pulse signal. The potential applied to the source electrodes of the second switching elements is different from ground potential.

10 Claims, 10 Drawing Sheets

IMAGE SENSOR PROVIDING OUTPUT IMAGE SIGNAL WITH REDUCED OFFSET

BACKGROUND OF THE INVENTION

The present invention relates to an image sensor used in image scanners, facsimile machines, and the like, and more particularly to an image sensor capable of producing stabilized image signals, and therefore ensuring an exact image read.

In a conventional image sensor, particularly a contact type image sensor, the length of the image sensor is equal to the width of the original document placed thereon for an image reading. The image on the original is projected on the image sensor at the ratio of 1:1. The image sensor outputs the image projected thereon in the form of electrical signals. The image sensor receives the image projected thereon by a great number of photo sensing elements. In other words, it fetches the image information of the received image in the form of a great number of pixels.

In a TFT-drive image sensor typically known as a contact image sensor, the photo sensing elements, which are grouped into a plural number of blocks, generate charge when they receiving the image information. The charges from the photo sensing elements are primarily stored in stray capacitors in every block by using switching elements or thin film transistors (TFTs). Then, the charges are sequentially read out of the stray capacitors in the form of electrical signals at a rate of several hundreds kHz to several hundreds MHz. With use of the TFTs, a single drive IC is provided for the image read operation. Accordingly, the TFT-drive image sensor requires fewer drive ICs.

Figure 2:
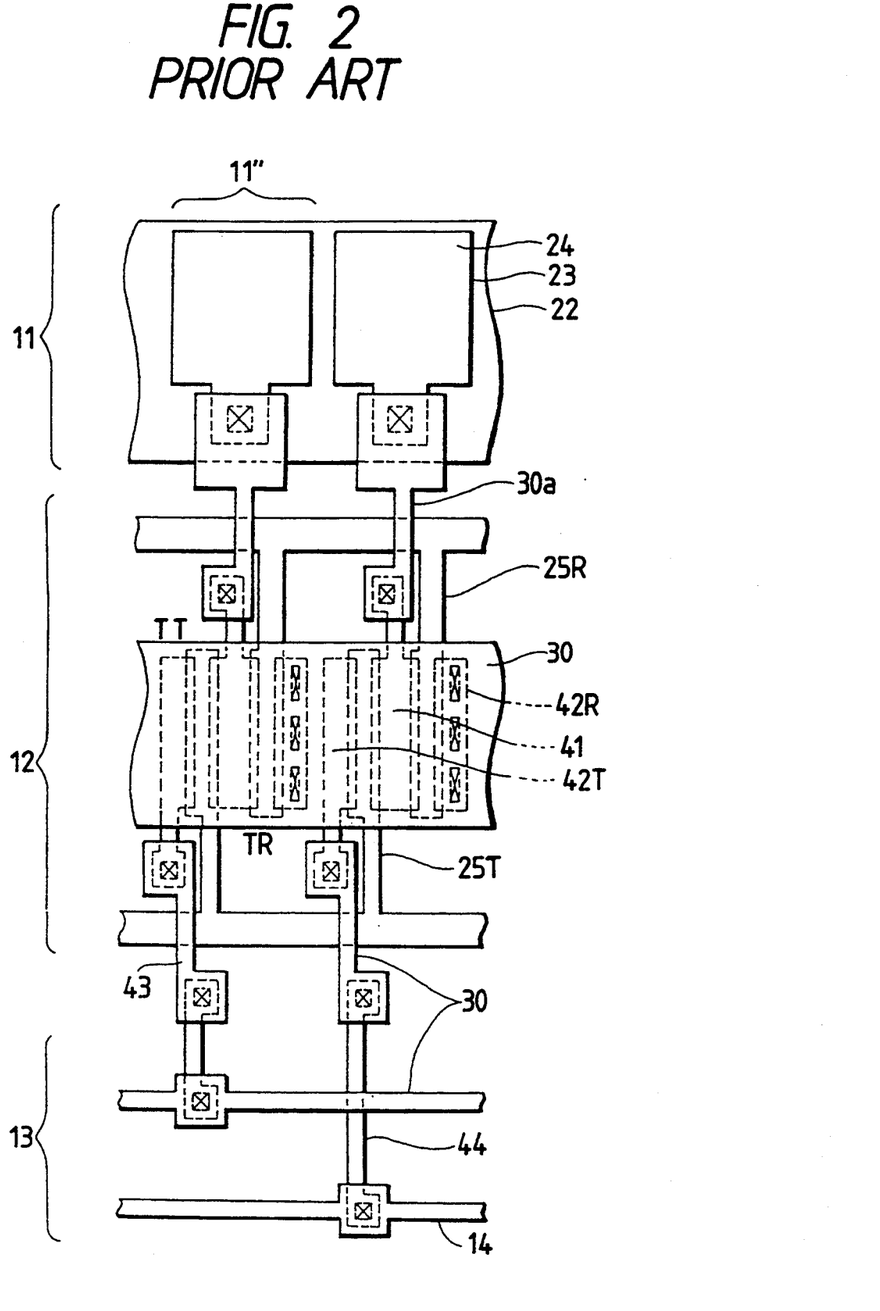

Turning to FIG. 2, there is shown an equivalent circuit of a conventional TFT-drive image sensor. As shown, the TFT-drive image sensor is made up of a sensor array 11, a charge transfer portion 12, and a matrix wire portion 13.

The sensor array 11 consists of a linear array consisting of a plural number of photo sensing elements 11''. The length of the linear array is approximately equal to the width of an original document.

The charge transfer portion 12 includes first thin film transistors TTi,j (i=1 to N and j=1 to N) provided for the photo sensing elements 11'' in one-to-one correspondence, and second thin film transistor TRi,j (i=1 to N and j=1 to N) also provided for the photo sensing elements 11'' in the same way.

The matrix wire portion 13 consists of multilayered wires arranged in a matrix fashion.

The first thin film transistors TTi,j are used for charge transfer. The second thin film transistors TRi,j remove the charge left in the photo sensing elements 11'', thereby resetting the photo sensing elements.

The sensor array 11 is divided into of an N number of blocks each consisting of n number of photo sensing elements 11''. The photo sensing elements 11'' may be equivalently expressed in terms of photo diode Pi,j (i=1 to N, and j=1 to n).

As shown, the photo sensing element 11'' is connected to the drain electrode of the first thin film transistor TTi,j, and also to the drain electrode of the second thin film transistor TRi,j. The source electrode of the second thin film transistor TRi,j is earthed. The source electrodes of the first thin film transistors TTi,j are connected through the matrix wire portion 13 to an n number of common signal lines 14, which are connected to a drive IC 15.

The gate electrodes of the first thin film transistors TTi,j and those of the second thin film transistors TRi,j are connected to a gate pulse generator 16, so that those transistors are turned on every block.

The light charges generated in the photo sensing elements 11'' are stored in the stray capacitors of the photo sensing elements and the train-gate overlap capacitors of the thin film transistors, for a preset period of time. Then, the charges are successively transferred to the wire capacitors CLi (i=1 to n) of the matrix wire portion 13 by the first thin film transistor TTi,j as switching elements.

In operation, a gate pulse $\phi GT1$ is transferred from the gate pulse generator 16 through gate lines GTi (I=1 to n) to the first thin film transistors TTi,1 to TTi,n in the first block. These transistors are turned on, and the charges generated in the photo sensing elements 11'' in the first block are transferred and stored in the wire capacitors CLi. As the result of the storage of the charges, the potential of the grouped signal lines 14 is varied. The varied potential values are sequentially output from an output line 17 by successively turning on analog switches SWi (i=1 to n) (not shown) in the drive IC 15.

Further, the gate pulse generator 16 transfers a gate pulse $\phi GR1$ through a gate line GRi (i=1 to n) to the second thin film transistors TR1,2 to TR1,n in the first block, which are then turned on. As a result, the charges left in the stray capacitors of the photo sensing elements and the drain-gate overlap capacitors of the thin film transistors are removed.

Gate pulses $\phi GT2$ to $\phi GTn$ turn on the first thin film transistors TT2,1 to TT2,n TTN,1 to TTN,n in the second to Nth blocks, thereby to transfer the charges of the photo sensing elements of every block. Gate pulses $\phi GR2$ to $\phi GRn$ turn on the second thin film transistors TR2,1 to TR2,n TRN,1 to TRN,n in the second to Nth blocks, thereby removing the charges left in the photo sensing elements of every block. The varied potentials in the grouped signal lines 14, caused by the charges transferred thereto, are successively output. In this way, image signals of one line in the main scan direction on the original are obtained. Thereafter, the image sensor is returned to the home position by a suitable mechanical means, for example, roller means (not shown), and then the above sequence of operations is repeated until the image signals of the entire image on the original are obtained (see Published Unexamined Japanese Patent Application No. Hei. 2-265362).

The structure construction of the thus electrically arranged TFT-drive image sensor, which includes the photo sensing elements, and the first and second thin film transistors, will be described with reference to FIG. 2.

A wire 30a from a photo sensing element 11'' is connected to a drain electrode 41 of the first and second thin film transistors (TFTs) TT and TR. The drain electrode 41 is used commonly for the first and second thin film transistors in order to reduce the area of the image sensor, which extends in the vertical scan direction. In the first thin film transistor TT, a source electrode 42T extends to the matrix wire portion 13 where it is connected to grouped signal lines 14. The drain electrode 41 and the source electrode 42T partially overlap with the gate electrode 25T.

In the second thin film transistor TR, a source electrode 42R is connected to a light-shield layer 30 for shielding the first and second thin film transistors TT and TR from light. The light-shield layer 30 is kept at constant voltage level, e.g., ground potential. The drain electrode 41 and the source electrode 42R partially overlap with the gate electrode 25R.

The method of reading image information on the original by the TFT-drive image sensor thus constructed will be described with reference to FIG. 3 showing a timing chart.

Figure 3A:
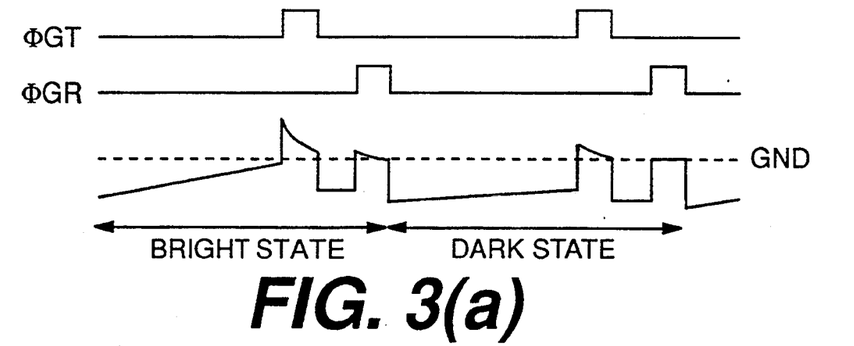
FIG. 3 is a set of waveforms of potentials at key nodes in the image sensor of the conventional invention.

A variation of the potential at the first thin film transistor TT is illustrated in FIG. 3(a). As shown, in a dark state, the potential gradually increases with time during the light charge storage. In a bright state, it increases relatively greatly. When the thin film transistor TT is turned on, its conduction increases steeply by a voltage caused by a feed-through voltage (referred to as a feed-through-caused-voltage).

As previously, in the transistor, the source and drain electrodes partially overlap with the gate electrode. Accordingly, the transistor inevitably contains overlap capacitance. When a large gate pulse is applied to the gate electrode, the potential is instantaneously increased by action of the overlap capacitance. When the gate pulse is removed, the potential is instantaneously decreased. The instantaneous increase or decrease of voltage is the feed-through voltage. The amplitude of the feed-through voltage is expressed by the product of multiplying the difference between the gate voltages of the on and off states of the gate pulse, viz., a gate voltage swing, by a ratio of the overlap capacitance to the capacitor connected to the source or drain electrode.

The charge is transferred from the drain electrode of the first thin film transistor TT so that the potential at the drain electrode is in equilibrium with the potential at the source electrode. The potential of the drain electrode decreases, to turn off the first thin film transistor TT. When the transistor is turned off, the potential at the drain electrode drops steeply by the feed-through-caused-voltage. The potential still present on the drain electrode after the drop in potential, is the potential caused by a residual charge. The second thin film transistor TR is turned on. Then, the potential on the drain electrode abruptly increases by the fed-through-caused-voltage. Then, the charge is transferred till it reaches the ground potential, and the potential decreases. When the second thin film transistor TR is turned off, the potential abruptly decreases by the feed-through-caused-voltage. Another charge storage starts at the decreased potential.

Figure 3B:
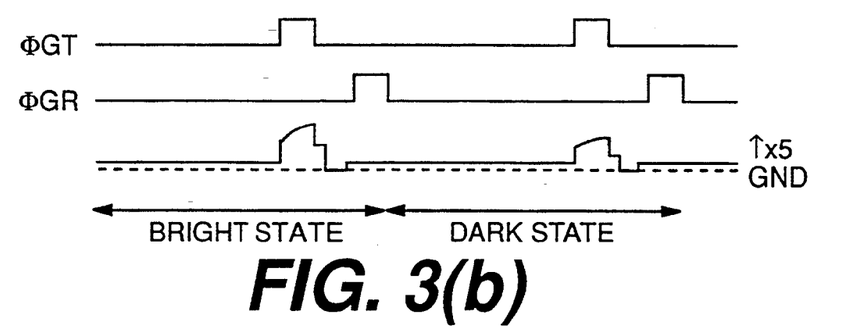

As shown in FIG. 3(b), at the source electrode of the first thin film transistor TT the potential is constant during the period of the light charge storage. When the first thin film transistor TT for charge transfer is turned on, the potential thereat abruptly increases by the feed-through-caused-voltage. At this time, the charge is transferred from the source electrode of the first thin film transistor TT so that the potential at the source electrode is in equilibrium with the potential at the drain electrode. And the potential at the source electrode increases to turn off the first thin film transistor TT. When the first thin film transistor TT is turned off, the potential at the source is abruptly decreased by the feed-through-caused-voltage. That potential is sensed and corresponds to the quantity of the transferred charge.

The MOS transistor is turned on by a negative voltage, and the potential deceases by the feed-through-caused-voltage. The charge is transferred till the potential reaches the ground potential, so that the potential decreases. In this case, the reset overlaps with the voltage drop by the feed-through-caused-voltage since the on-resistance of the MOS transistor is smaller than that of the thin film transistor. The MOS transistor is turned off, and the potential sharply increases by the feed-through-caused-voltage. This potential is the potential in the initial stage, and is sensed as a reference potential. The difference between the potential previously sensed an the reference potential is the sensor output signal.

In the conventional image sensor, if a great offset is created in the sensor output signal by an alignment displacement, which is caused in the fabricating stage, the light charge start potential (the potential at which the light charge storage starts) at the drain electrode of the first or charge-transfer thin film transistor TT is greatly shifted to the positive or the negative side. The output potential at the source electrode of the first thin film transistor TT is greatly shifted to the positive or the negative side. Accordingly, the output signal in the dark state does not approximate to 0 (zero). The range of the amplifier for amplifying the sensor output signal is large, so that the output signal of the amplifier greatly varies, viz., the sensor output is instable.

This offset problem will be described in detail.

In the case of the image sensor constructed as shown in FIG. 2, if the overlapping areas of the source and drain electrodes with the gate electrode in the first and second thin film transistors TT and TR are charged by the alignment displacement, the overlap capacitance of the overlapping areas change. Further, the feed-through-caused-voltage in the first thin film transistor TT is different from that in the second thin film transistor TR. As a consequence, a great positive or negative going offset is created.

In the image sensor of FIG. 2, a chromium (Cr1) layer is used for forming the gate electrode 25T of the first thin film transistor TT. The gate electrode 25R of a second thin film transistor TR is also formed with the chromium layer. A chromium layer (Cr2) is used for forming the drain and the source electrodes of the transistors TT and TR.

Let us consider a case where the areas of the drain and the source electrodes 41, and 42T and 42R, overlapping with the gate electrodes 25T and 25R, are displaced to the left from the gate electrodes. In the first thin film transistor TT, the overlapping area of the gate electrode 25T with the drain electrode 41 increases, while the overlapping area of the gate electrode 25T with the source electrode 42T decreases. In the second thin film transistor TR, the overlapping area of the gate electrode 25R with the drain electrode 41 decreases while the overlapping area of the gate electrode 25R with the source electrode 42R increases.

Figure 3C:
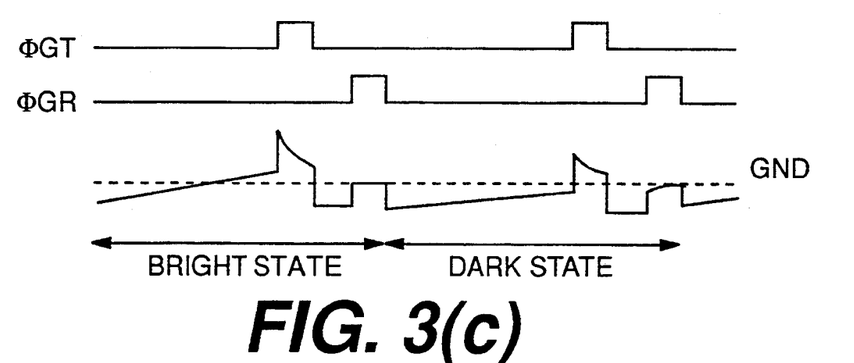
Figure 3D:
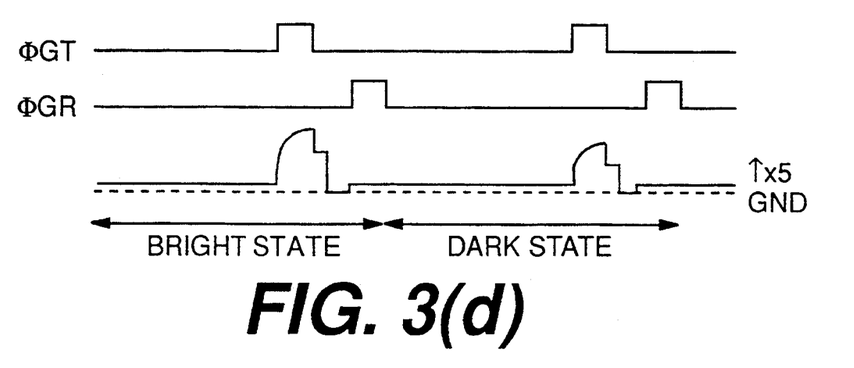

In this case, the feed-through-caused-voltage at the drain electrode of each of those thin film transistors, as shown in FIG. 3(c), is large in the first thin film transistor TT in which the area overlapping with the drain electrode 41 is large. It is small in the second thin film transistor TR in which the area overlapping with the drain electrode 41 is small. Accordingly, the potential after the resetting operation by the second thin film transistor TR does not become small in comparison with that shown in FIG. 3(a). This results in an offset going greatly positive with respect to the light charge storage start potential at the drain electrode. As shown in FIG. 3(d), the output potential at the source electrode of the first thin film transistor TT has a large positive going offset. In other words, the dark output signal in the dark state is large.

In another case in FIG. 2 where the areas of the drain and the source electrodes 41, and 42T and 42R, overlapping with gate electrodes 25T and 25R, are displaced from the gate electrodes to the right, in the first thin film transistor TT, the overlapping area of the grate electrode 25T and the drain electrode 41 increases, while the overlapping area of the gate electrode 25T and the source electrode 42T decreases. In the second thin film transistor TR, the overlapping area of the gate electrode 25R and the drain electrode 41 decreases while the overlapping area of the gate electrode 25R and the source electrode 42R increases. Therefore, the offsets of the alignment described above cause an instable output.

SUMMARY OF THE INVENTION

The present invention has been made in view of the above circumstances and has an object to provide an image sensor which produces a stabilized image output signal by minimizing the offsets.

To achieve the above object, according to a first aspect of the present invention, there is provided an image sensor comprising: photo sensing elements, having charge storage capability, for transducing received light into electrical quantities; first switching elements, having charge storage capability, for transferring the charge stored in the photo sensing elements; second switching elements, having charge storage capability, for resetting the photo sensing elements by removing the charge still left in the photo sensing elements after the charge transfer; first gate pulse generator for generating a first pulse signal to be applied to the first switching elements; and second gate pulse generator for generating a second pulse signal to be applied to the second switching elements, the amplitude of the second pulse signal being different from that of the first pulse signal.

In the image sensor, the first pulse signal may be larger or smaller in amplitude than the second pulse signal.

According to a second aspect of the invention, there is provided an image sensor comprising: photo sensing elements, having charge storage capability, for transducing received light into electrical quantities; first switching elements, having charge storage capability, for transferring the charge stored in the photo sensing elements; second switching elements, having charge storage capability, for resetting the photo sensing elements by removing the charge still left in the photo sensing elements after the charge transfer; wherein the first and second switching elements, each including a gate electrode, a source electrode, and a drain electrode are arrayed such that the source electrode of the first and second switching elements are aligned in the vertical scan direction, and the drain electrodes are also aligned in the same direction.

According to a third aspect of the invention, there is provided an image sensor comprising: photo sensing elements, having charge storage capability, for transducing received light into electrical quantities; first switching elements, having charge storage capability, for transferring the charge stored in the photo sensing element; second switching elements, having charge storage capability, for resetting the photo sensing elements by removing the charge still left in the photo sensing elements after the charge transfer; wherein the source electrode overlaps with the gate electrode, and the drain electrode also overlaps with the gate electrode, thereby forming overlap capacitance, and the overlap capacitance of the second switching element is larger than that of the first switching element.

In the image sensor, when the ratio of W/L of the first switching element is 9, the ratio of W/L of the second switching element is within 12 to 15 where W indicates the length of the gate electrode as viewed in the main scan direction, and L indicates the length of each of the source and the drain electrodes as viewed in the vertical scan direction.

According to a fourth aspect of the invention, there is provided an image sensor comprising: photo sensing elements, having charge storage capability, for transducing received light into electrical quantities; first switching elements, having charge storage capability, for transferring the charge stored in the photo sensing elements; second switching elements, having charge storage capability, for resetting the photo sensing elements by removing the charge still left in the photo sensing elements after the charge transfer; wherein the potential applied to the source electrode of the second switching element is not equal to the ground potential.

In the image sensor, the potential applied to the source electrode of the second switching element may be lower or higher than the ground potential.

In the image sensor according to the first aspect of the present invention, the amplitudes of the first pulse signal applied from the first gate pulse generator to the first switching elements is different from the amplitude of the second pulse signal applied from the second gate pulse generator to the second switching elements. Accordingly, the voltage caused by a feed-through voltage (referred to as a feed-through-caused-voltage) of the first or second switching element can be controlled, thereby adjusting a positive or negative going offset in the image output signal.

In the image sensor, the first pulse signal may be larger or smaller in amplitude than the second pulse signal.

The case where the first pulse signal is larger in amplitude than the second pulse signal, is applied to such a situation where an alignment displacement decreases the feed-through-caused-voltage in the second switching element. In the situation, the feed-through-caused-voltage may be increased, thereby adjusting the positive going offset.

The case where the first pulse signal is smaller in amplitude than the second pulse signal, is applied to such a situation where an alignment displacement increases the feed-through-caused-voltage in the second switching element. In the situation, the feed-through-caused-voltage may be decreased, thereby adjusting the negative going offset.

In the image sensor according to the second aspect of the invention, the source electrodes of the first an second switching elements are aligned in the vertical scan direction, and the drain electrodes are also aligned in the same direction.

With such a structure, when the image sensor involves an aligned displacement, both switching elements have equal displacements. Accordingly, the feed-through-caused-voltages of the first and second switching elements have equal changes of voltage. As a result, the image output signal is little varied.

In the image sensor according to yet another aspect of the invention, the source electrode overlaps with the gate electrode, and the drain electrode also overlaps with the gate electrode, thereby forming overlap capacitance, and the overlap capacitance of the second switching element is larger than that of the first switching element.

For such an alignment displacement as to decrease the feed-through-caused-voltage in the second switching element, the overlap capacitance of the second switching element is large, thereby compensating for the decrease of the feed-through-caused-voltage. The positive going offset in the image output signal can be adjusted.

In the image sensor, when the ratio of W/L of the first switching element is 9, the ratio of W/L of the second switching element is within 12 to 15 where W indicates the length of the gate electrode as viewed in the main or horizontal scan direction, and L indicates the length of each of the source and the drain electrodes as viewed in the vertical scan direction.

For such an alignment displacement as to decrease the feed-through-caused-voltage in the second switching element, the overlap capacitance of the second switching element is large, thereby compensating for the decrease of the feed-through-caused-voltage. The positive going offset in the image output signal can be adjusted.

In the image sensor according to the fourth aspect of the invention, the reset potential applied to the source electrode of the second switching element is not equal to the ground potential.

When the feed-through-caused-voltage in the second switching element is small, the reset potential is selected to be lower than the ground potential. When the feed-through-caused-voltage is large, the reset potential is selected to be higher than the ground potential. With this selection, the positive or negative going offset in the image output signal can be adjusted.

In the image sensor, the potential applied to the source electrode of the second switching element may be lower or higher than the ground potential.

The case where the former is lower than the latter is applied to such a situation that the feed-through-caused-voltage is small, thereby adjusting the positive going offset.

The case where the former is larger than the latter is applied to such a situation that the feed-through-caused-voltage is large, thereby adjusting the negative going offset.

DETAILED DESCRIPTION OF THE PREFERRED EMBODIMENTS

Figure 4:
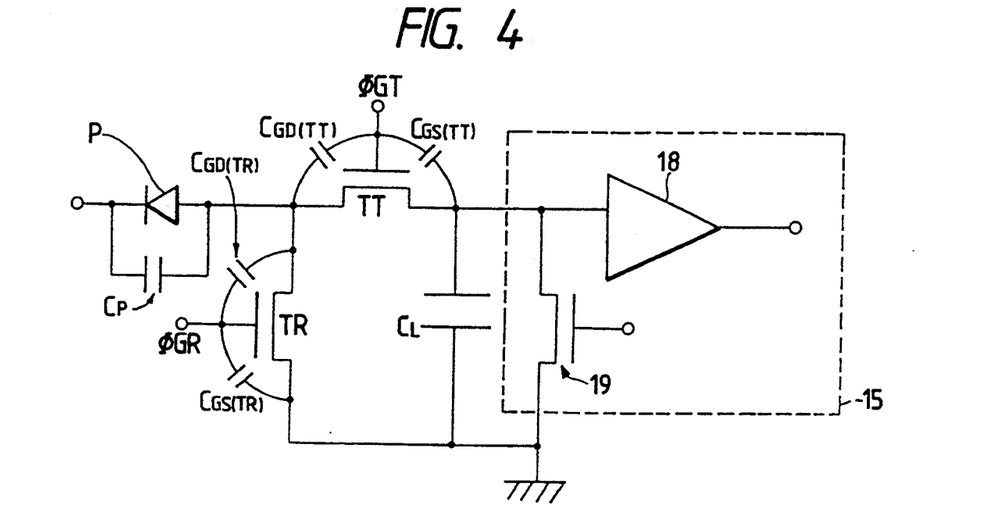
FIG. 4 is an equivalent circuit diagram of one pixel of an image sensor according to an embodiment of the present invention.

One pixel of the image sensor according to a first embodiment of the invention may be electrically expressed as shown in FIG. 4. As shown, the pixel is made up of a photo diode P, a capacitor defined by a stray capacitance Cp of the photo diode (the capacitor also designated by Cp), a first thin film transistor TT, a second thin film transistor TR, a capacitor defined by a wire capacitance CL (the capacitor also designated by CL), an amplifier 18, and a MOS transistor 19 for resetting the wire. The amplifier 18 and the MOS transistor 19 are included in a drive IC 15. An overlap capacitance CGT(TT) is formed between the gate electrode and the drain electrode of the first thin film transistor TT. An overlap capacitance CGS(TT) is formed between the gate electrode and the source electrode of the transistor TT. An overlap capacitance CGD(TR) is formed between the gate electrode and the drain electrode of the second thin film transistor TR. An overlap capacitance CGS(TR) is formed between the gate electrode and the source electrode of the transistor TR. A gate pulse $\phi$GT is applied to the gate electrode of the first thin film transistor TT. A gate pulse $\phi$GR is applied to the gate electrode of the second thin film transistor TR.

Figure 5:
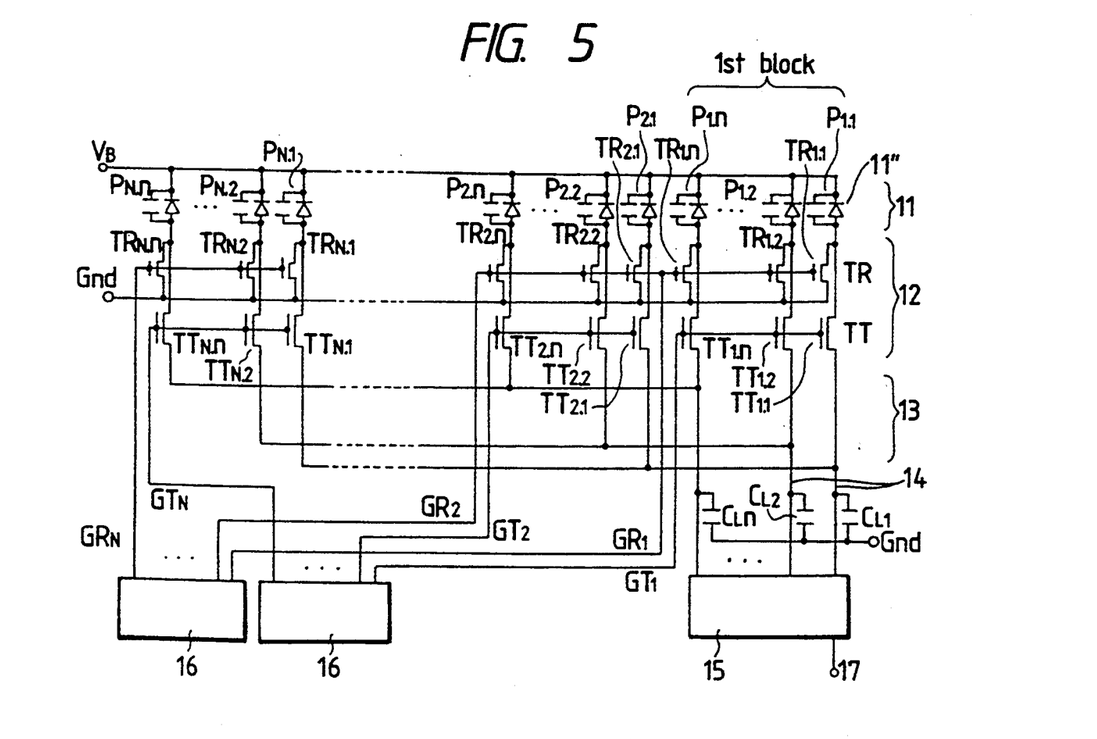
FIG. 5 is an equivalent circuit diagram showing the overall image sensor of FIG. 4.

As shown in FIGS. 4 and 5, a sensor array 11 is made up of an N number of blocks each consisting of an n number of photo sensing elements 11" as photo diodes P.

As shown, the photo diode P of the photo sensing element 11" is connected to the drain electrode of the first thin film transistor TT, and also to the drain electrode of the second thin film transistor TR. The source electrode of the second thin film transistor TR is earthed. The source electrodes of the first thin film transistors TT are connected through the matrix wire portion 13 to common signal lines 14. The grouped signal lines 14 are connected to charge sensing amplifiers 18 and wire resetting MOS transistors 19, both contained in a drive IC 15.

The gate electrodes of the first thin film transistors TT are connected every block to a first gate pulse generator 16, through transfer gate signal lines GT. The gate electrodes of the second film transistors TR are connected every block to a second gate pulse generator 16', through reset gate signal lines GR.

The voltage value of the gate pulse $\phi$GT generated from the gate pulse generator 16 may be different from that of the gate pulse $\phi$GT from the second gate pulse generator 16'. The image sensor may be driven using the different voltage values.

The structure of one photo sensing element 11" used in the image sensor of the invention is typically described with reference to FIGS. 7 and 8.

As shown, the photo sensing element 11" is formed with a metal electrode 22, a photoconductive layer 23, and a transparent electrode 24, which are layered in this order on a substrate 21 made of glass or ceramic, for example. In other words, the photo sensing element has the structure of the sandwich type in which the photoconductive layer 23 is sandwiched between the metal electrode 22 and the transparent electrode 24.

The metal electrode 22 made of chromium (Cr), for example, is shaped like a strip extending in the main scan direction. The metal electrode 22 serves as a lower electrode, which is common to all other photo sensing elements 11".

The photoconductive layer 23, made of hydrogenated amorphous silicon (a-Si: H), is discretely provided for each photo sensing element (each bit). Cadmium selenium may also be used for the photoconductive layer 23, instead of the hydrogenated amorphous silicon. The transparent electrode 24, which is made of indium tin oxide (ITO), is also discretely provided for each photo sensing element. The electrode 24 serves as an upper electrode of the photo sensing element.

A number of the photo sensing elements thus constructed are linearly arrayed to form the sensor array 11. The metal electrode 22 is coupled with a fixed voltage VB.

One end of a wire 30a made of aluminum (Al), for example, is connected to one end of the discrete transparent electrode 24. The other end of the wire 30a is connected to the drain electrodes 41T and 41TR of the first thin film transistor TTi, j (i=1 to N, j=1 to n) and the second thin film transistor TRi, j (i=1 to N, j=1 to n) in the charge transfer portion 12.

If the photoconductive layer 23 of a-si: H is formed as a single layer, the optoelectric converting action occurs a photo sensing element affects an influence on the photo sensing elements adjacent to it. To eliminate the influence, the discrete photoconductive layers 23 and the transparent electrodes 24 are discretely formed.

Figure 9:
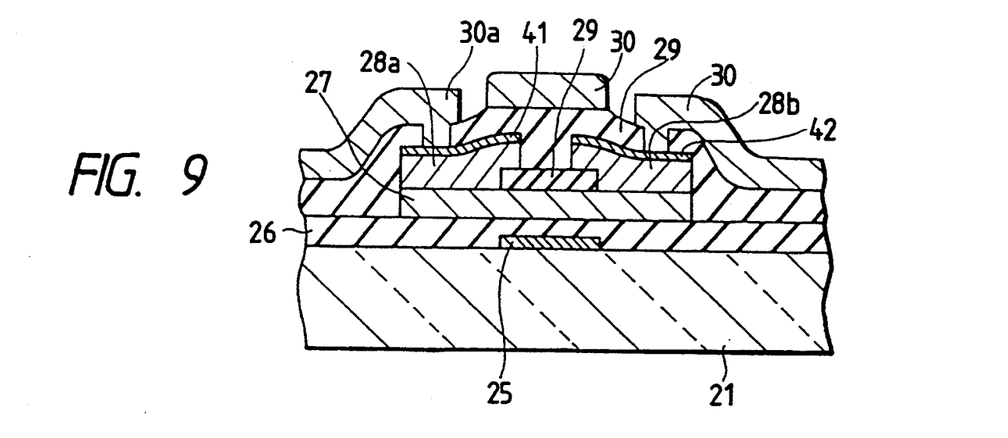
FIG. 9 is a cross sectional view taken on line B—B in FIG. 7.

The structure of the thin film transistor used as the first and second thin film transistors will be described with reference to FIGS. 7 and 9. In the thin film transistor of the reverse having the structure of the reverse stagger type, a gate insulating layer 26 of chromium is formed on the substrate 21.

A gate insulating layer 26 of silicon nitride (SiNx) is formed over the substrate 21 having the gate insulating layer 26 thereon.

A semiconductor active layer 27 of a-Si: H is formed on the gate insulating layer 26. A channel protecting layer 29 made of SiNx formed on the semiconductor active layer 27 is located above the gate electrode 25.

An ohmic contact layer 28 of n+ a-Si: H is formed over the semiconductor active layer 27. Having the channel protecting layer 29 thereon. The ohmic contact layer 28 is divided into two portions, the first portion 28a in contact with the drain electrode 41 formed thereover and the second portion 28b in contact with the source electrode 42 formed thereover. The drain and source electrode 41 and 42 are made of chromium (Cr2).

An interlayer insulating layer of polyimide is formed over those electrodes. A wire 30a is further formed thereover. On the channel protecting layer 29 an aluminum layer 30 is formed for shielding the a-Si: H layer from light.

That is, the light-shield layer 30 shuts off light entering through the channel protecting layer 29 into the a-Si: H layer; otherwise light enters the a-Si: H layer to cause an optoelectric transducing action therein.

The drain and source electrodes 41 and 42 as the Cr2 layers, which covers the ohmic contact layer portions 28a and 28b, protects the ohmic contact layer portions against aluminum applied when the wire layer is formed by vapor deposition process or sputtering process, thereby ensuring the required property of the semiconductor active layer 27 of a-Si: H.

Figure 7:
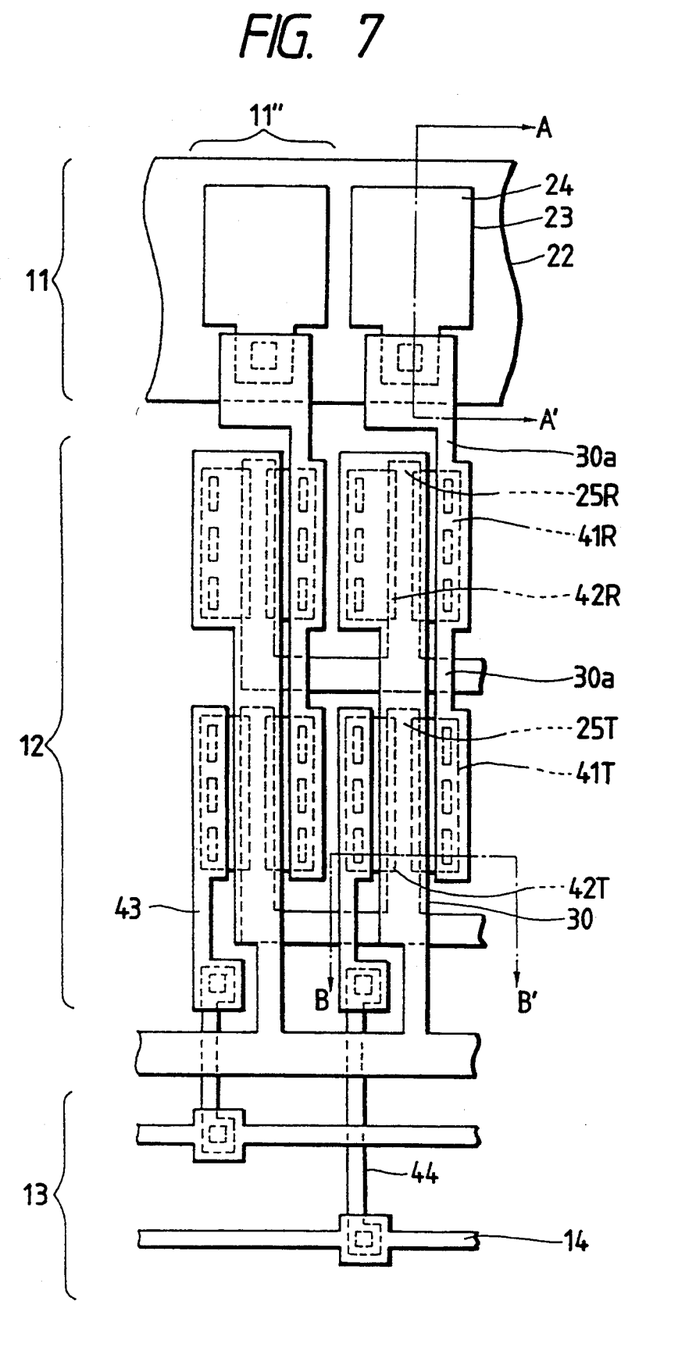
FIG. 7 is a plan view showing a part of the image sensor including a photo sensing portion, a charge transfer portion, and a matrix wiring portion in the image sensor of FIG. 4.
Figure 8:
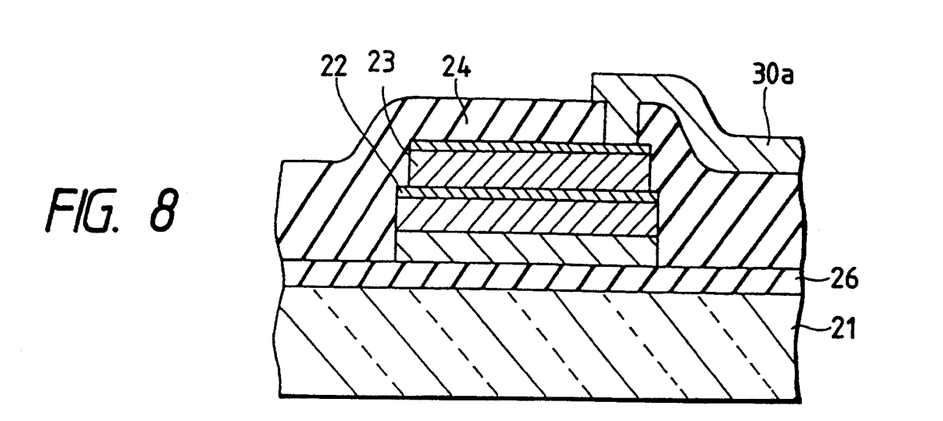
FIG. 8 is a cross sectional view taken on line A—A in FIG. 7.

As shown in FIG. 7, the source electrode 42 is connected through a wire 43 as aluminum to a wire 44 as a chromium (Cr1) layer in the matrix wire portion 13, and to a common signal line 14 as an aluminum layer. The signal line 14 is further connected to a drive IC (not shown).

The operation of the image sensor of the first embodiment thus constructed will be described.

The charge generated by a photo sensing element 11" is stored for a present time period in the stray capacitor Cp of the photo sensing element and the capacitors defined by the drain gate overlap capacitance CGD(TT) and CGD(TR) of the first and second thin film transistors TT and TR (the capacitors also denoted as CGD(TT) and CGD(TR). The first thin film transistor TT as a switch element is turned on by a gate pulse $\phi$GT from the gate pulse generator 16. The charge is transferred to the wire capacitor CL. The charge stored in the wire capacitor CL causes potential on the common signal line 14 to vary. After the first thin film transistor TT is turned off, the amplifier 18 senses and amplifies the varied potential or voltage, and outputs the amplified one. After the voltage is sensed, the MOS transistor 19 resets the wire capacitor CL. The potential on the wire capacitor is sensed as a reference potential.

A gate pulse $\phi$GR generated by the second gate pulse generator 16' turns on the second thin film transistor TR, so that the potential at the drain electrodes of the first and second thin film transistors TT and TR becomes ground potential. The charge left in the stray capacitor Cp and the drain-gate overlap capacitors CGD(TT) and CGD(TR) are removed, thereby to reset the photo sensing element 11" and the first and second thin film transistors TT and TR.

Variations of potentials at key nodes in the image sensor when the sensor operates will be described with reference to FIG. 6.

Figure 6A:
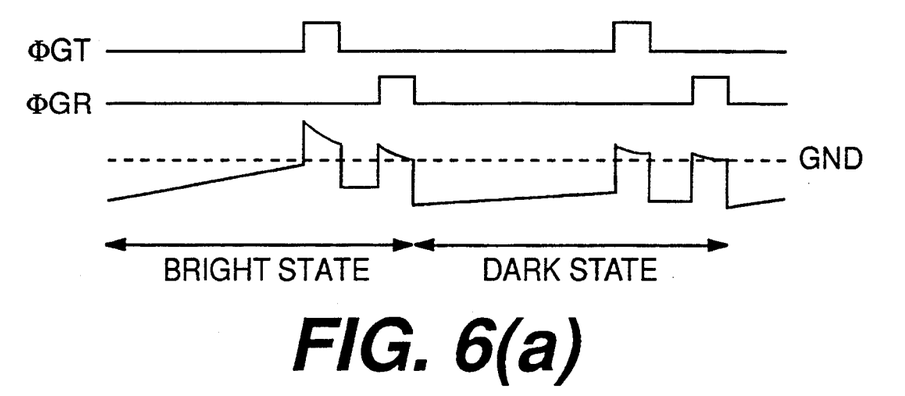
FIG. 6 is a set of waveforms of potentials at key nodes in the image sensor when the sensor operates.
Figure 6B:
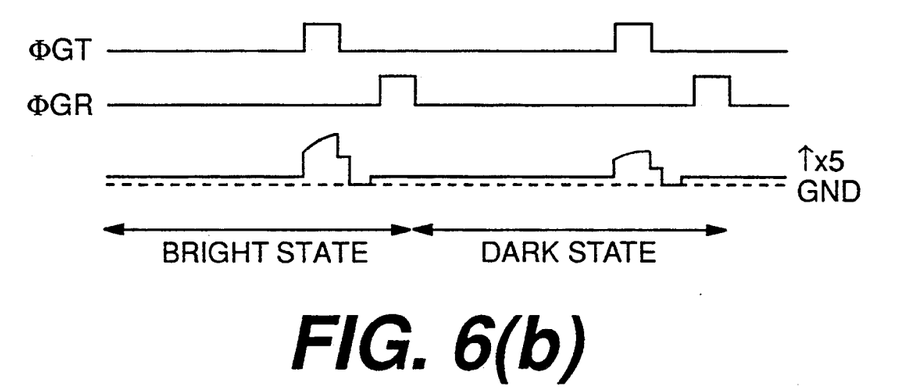

In a case where no alignment displacement takes place in the manufacturing process, the potential at the drain electrode of the first thin film transistor TT varies as shown in FIG. 6(a). The potential at the source electrode of the second thin film transistor TR varies as shown in FIG. 5(b).

In a case where an alignment displacement takes place, for example, a case where the overlap area between the drain and gate electrodes of the first thin film transistor TT is large, while the overlap area of the drain and gate electrodes of the second thin film transistor TR is small, the potential at the drain electrode of the first thin film transistor TT is increased by a potential or voltage caused by the feed-through voltage (this potential will be referred to as a feed-through-caused potential or voltage) during the charge transfer period. It is decreased by the feed-through-caused-voltage during the reset period (see FIG. 6(c)). As a result, an offset of the output potential at the source electrode of the first thin film transistor TT becomes large in the positive direction (FIG. 6(d)).

Figure 6C:
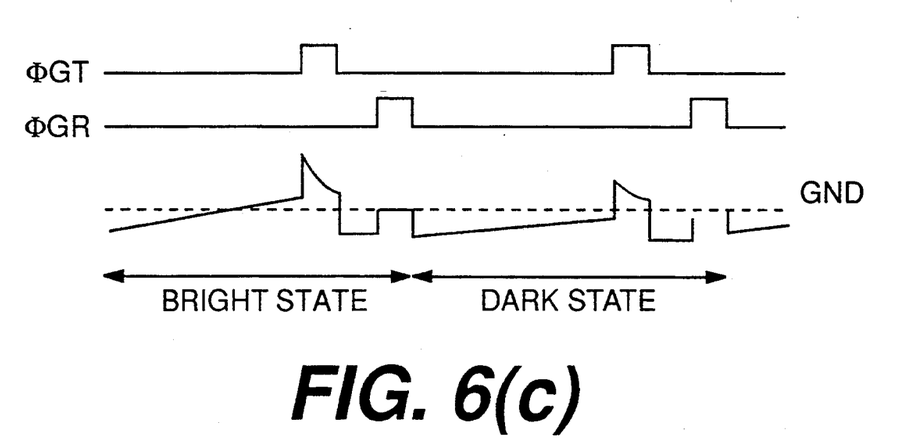
Figure 6D:
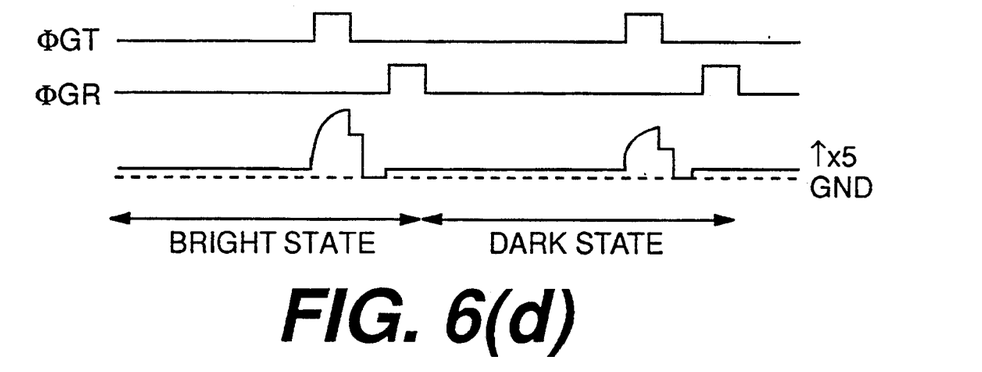
Figure 6E:
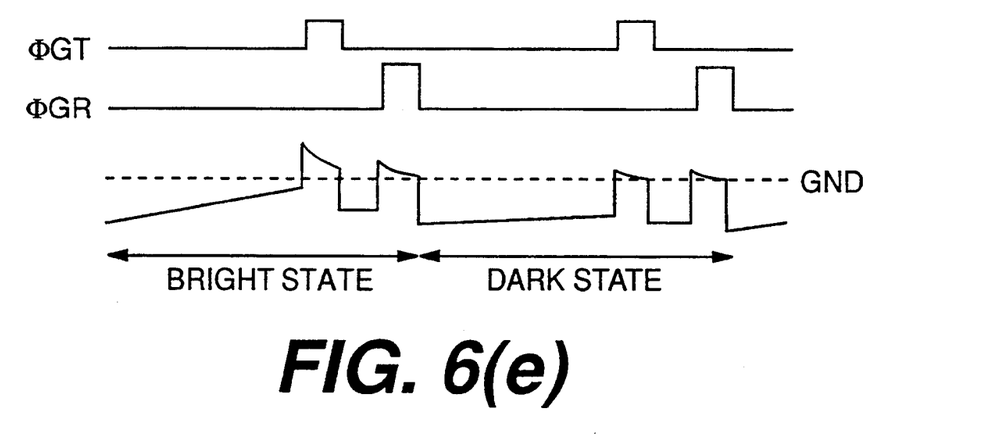
Figure 6F:
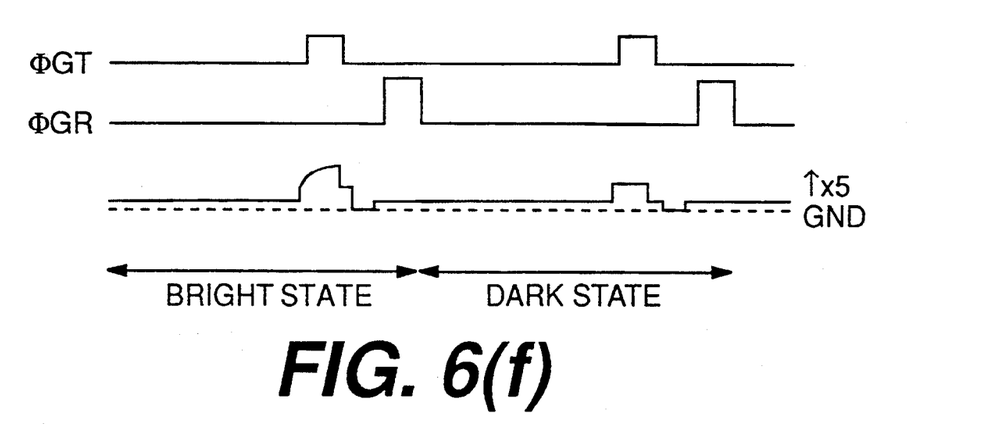

In the FIG. 5 image sensor of the first embodiment, adjustment is made such that the potential by the feed-through voltage in the second thin film transistor TR is increased in a manner that the voltage of the second gate pulse generator 16' is selected to be larger than the voltage of the first gate pulse generator 16 .(FIG. 6(e)), and that the positive going offset of the output potential at the source electrode of the first thin film transistor TT is suppressed for reduction by lowering the charge storage start potential (FIG. 6(f)). Accordingly, in a dark state, the output potential is substantially zero, and hence the offset disappears (FIG. 6(f)).

The adjustment as mentioned above is for adjusting the positive going offset. The adjustment for adjusting the negative going offset will be described. In a case where an alignment displacement takes place such that the overlap area between the drain and gate electrodes of the first thin film transistor TT is small, while the overlap area of the drain and gate electrodes of the second thin film transistor TR is large, the potential by the feed-through-caused-voltage during the charge transfer period is small, while the feed-through-caused-voltage during the reset period is large. Accordingly, a negative going offset appears. In this case, to Suppress the negative going offset of the output potential at the source electrode of the first thin film transistor TT, the voltage of the first gate pulse generator 16 is selected to be larger than the voltage of the second gate pulse generator 16', thereby increasing the feed-through-caused-voltage in the first thin film transistor TT.

In the first embodiment, the geometry and the characteristic of the first thin film transistor TT are selected to be equal to those of the second thin film transistor TR, in order to reduce the output offsets.

It is evident that the first and second first thin film transistors TT and TR may have different geometries and characteristics.

The matter essential to the invention is that the feed-through-caused-voltage of the first thin film transistor TT at the time of the charge transfer operation, and the feed-through-caused-voltage of the second thin film transistor TR at the time of the reset operation are both variable for adjustment.

In a case where the geometries/characteristics of the first and second first thin film transistors TT and TR are the same, W/L of (W: length of the source/drain electrode as viewed in the vertical scan direction, and L: the length of the gate electrode in the horizontal scan direction) each thin film transistor is approximately 8 to 18, the stray capacitor Cp is approximately 1 pF, and the wire capacitance CL is approximately 10 to 100 pF.

As described above, the positive or negative going offset of the output image signal of the image sensor can be suppressed in a manner that the feed-through-caused-voltages in the first and second thin film transistors TT and TR are adjusted by varying the amplitudes of the gate pulses applied from the first and second gate pulse generators 16 and 16' to the gate electrodes thereof.

Therefore, the output potential of the image sensor in a dark state can be approximate to zero. Additionally, the variation of the sensor output signal is minimized, thereby stabilizing the sensor output signal.

An alternative for the adjustment of the feed-through-caused-voltage for suppressing the offset, which is carried out by varying the amplitudes of the gate pulses, is allowed in the invention. In the alternative, in the design stage, the overlap area of the drain electrode and the gate electrode is large while the overlap area of the source electrode and the gate electrode is small, and vice versa.

Figure 10A:
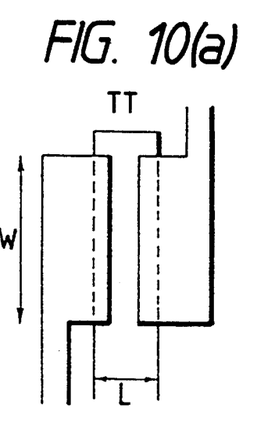
FIG. 10A is a plan view showing a modification of the areas of the source and the drain electrodes of a first thin film transistor with the gate electrode.
Figure 10B:
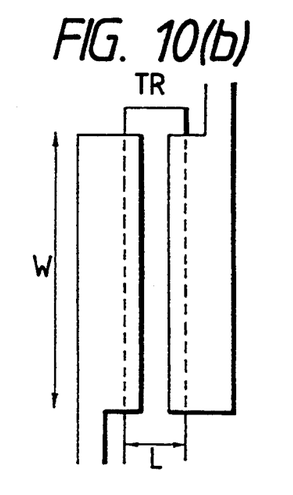
FIG. 10B is a plan view showing a modification of the areas of the source and the drain electrodes of a second thin film transistor with the gate electrode.

Let us consider a case where an alignment displacement is present and no adjustment of the feed-through-caused-voltage is carried out, and the potentials at the gate and the source electrodes vary as shown in FIGS. 6(c) and 6(d). In this case, the length W of the source/drain electrode (as viewed in the vertical scan direction) of the first thin film transistor TT is 90 to 135 $\mu$m, the length L of the gate electrode as viewed in the main scan direction is 10 to 15 $\mu$m (see FIG. 10A). The length L of the gate electrode of the second thin film transistor TR is equal to that of the first thin film transistor TT, viz., 10 to 15 $\mu$m, and the length W of the source/drain electrode of the second thin film transistor TR is 120 to 150 $\mu$m (see FIG. 10(b)).

In the image sensor of which the overlap areas are thus designed, the potentials on the gate and the source electrodes vary as shown in FIGS. 6(e) and 6(f).

An appropriate combination of the alternative with the first embodiment will more effectively suppress the offset.

Figure 1:
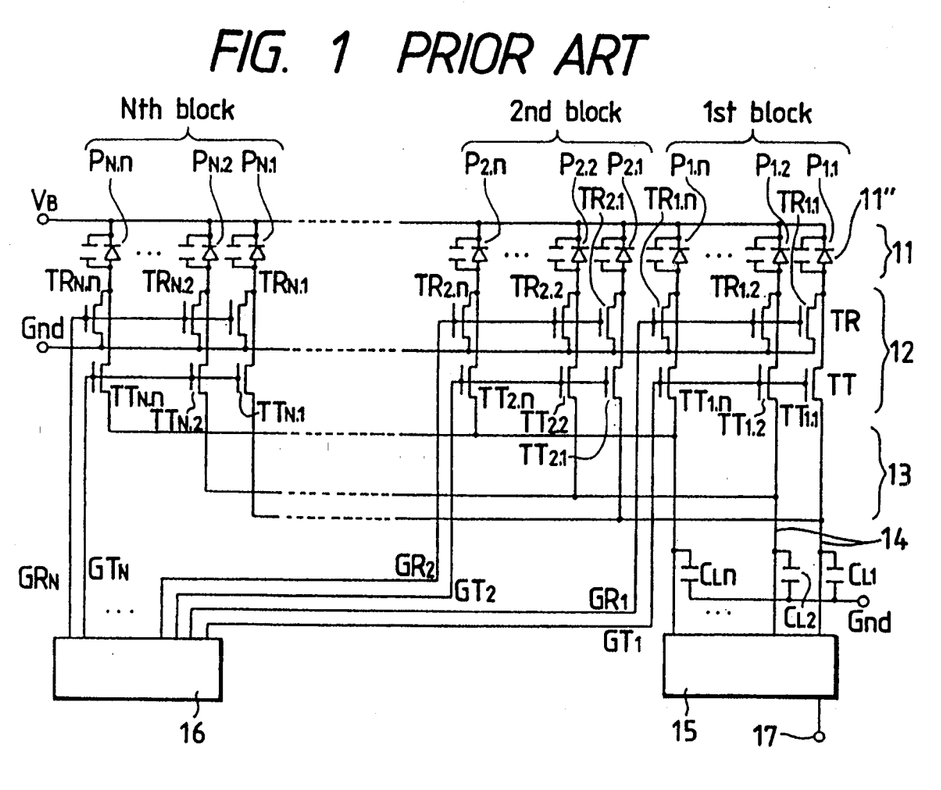
FIGS. 1, 2 show the conventional inventions.

As recalled, in the conventional image sensor shown in FIG. 1, the drain electrode is used for both the first and the second thin film transistors TT and TR. Those first and second thin film transistors are arrayed side by side in the horizontal direction.

On the other hand, in the image sensor of the first embodiment shown in FIG. 7, the first and second thin film transistors TT and TR are vertical arrayed such that the second thin film transistor TR is located closer to the sensor array 11 and the first thin film transistor TT is located closer to the matrix wire portion 13.

With the array of the first and the thin film transistors TT and TR, as shown in FIG. 7, the drain electrodes 41T and 41R of the transistors TT and TR are arrayed in parallel to the gate electrodes 25T and 25R. The source electrodes 42T and 42R are also arrayed in parallel to the gate electrodes.

In an alignment displacement, the overlap area of the source and the gate electrodes is substantially equal to that of the drain and the gate electrodes. This fact implies that the feed-through-caused-voltage in the first thin film transistor TT is substantially equal to that in the second thin film transistor TR. Therefore, the minimization of the sensor output signal variation, which is caused by the alignment displacement, is realized.

Figure 11:
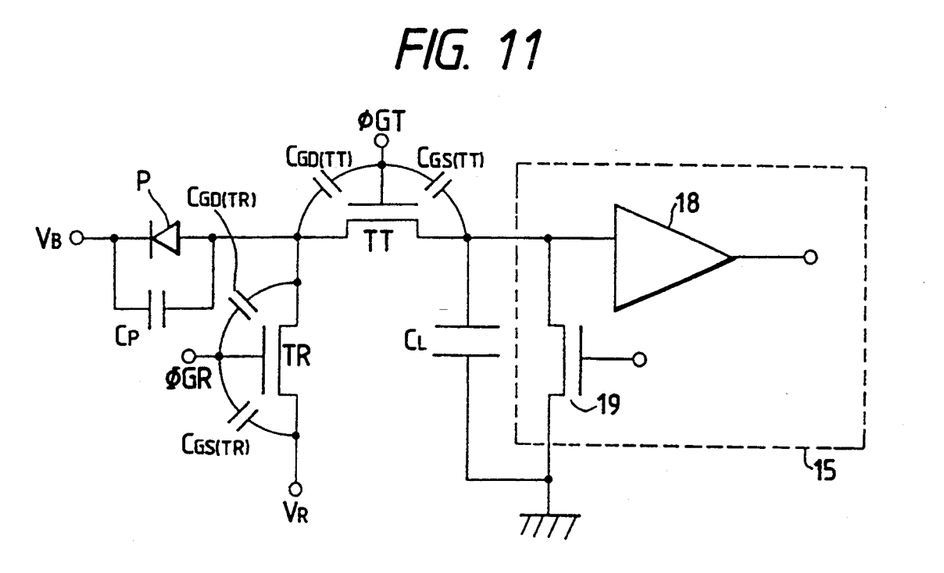
FIG. 11 is an equivalent circuit diagram of one pixel of an image sensor according to a second embodiment of the present invention.
Figure 12:
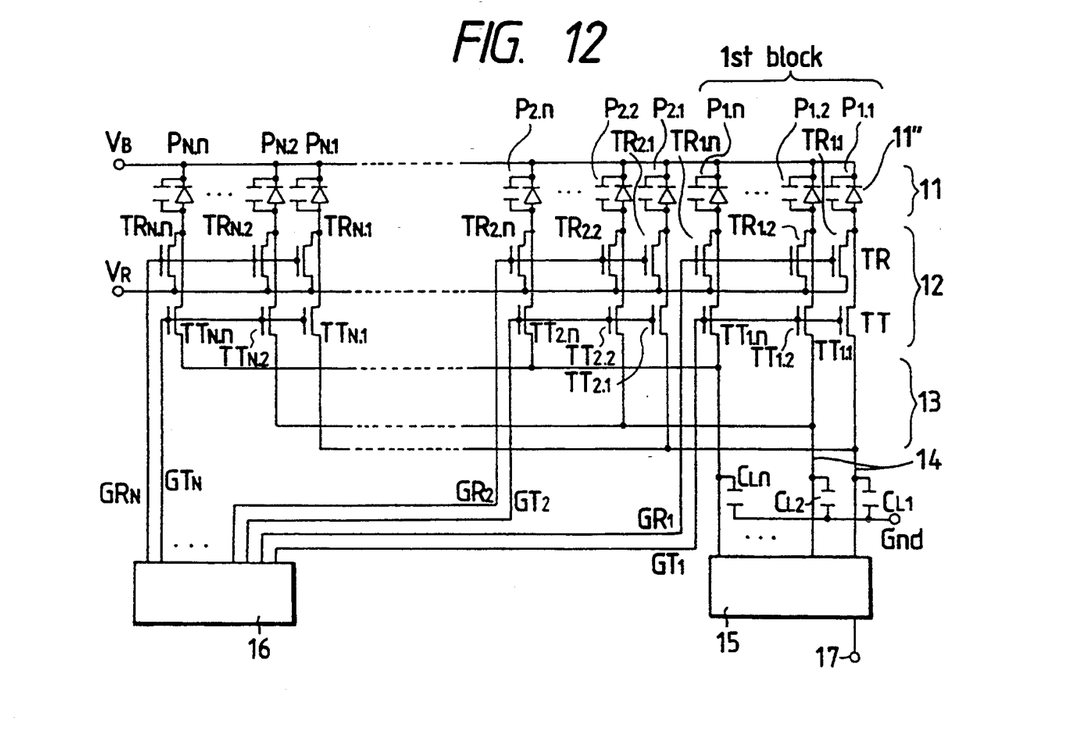
FIG. 12 is an equivalent circuit diagram showing the overall image sensor of FIG. 11.

Another embodiment of an image sensor according to another embodiment of the present invention will be described with reference to FIGS. 11 through 13. In these figures, like or equivalent portions are designated by like reference numerals in FIGS. 4 through 7.

The electrical arrangement of the image sensor of the second embodiment is basically equal to that of the image sensor of the first embodiment except the following points. In the second embodiment of FIG. 11, the same gate pulse is applied to the charge transfer and the reset thin film transistors TT and TR. Accordingly, a single gate pulse generator 16 is provided as shown in FIG. 12.

Additionally, the source electrode of the second thin film transistor TR is connected to an external, variable voltage source (not shown), not the ground potential. The variable voltage source applies a fixed potential VR (reset potential VR) to the source electrode. Accordingly, when the second thin film transistor TR is turned on, the potential at the drain electrode causes the residual charge to transfer till it is in equilibrium with the reset potential VR. The reset potential VR may be set to a proper value by the external variable voltage source.

How to set the rest potential VR will be described with reference to FIG. 13.

Figure 13A:
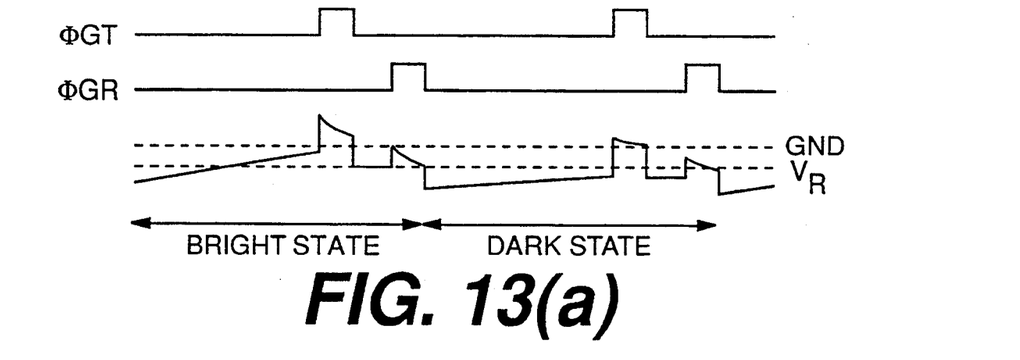
FIG. 13 is a set of waveforms of potentials at key nodes in the image sensor when the sensor operates.

In a case where an alignment displacement takes place in the manufacturing process, and the feed-through-caused-voltage in the second or reset thin film transistor TR is smaller than that in the first or charge-transfer thin film transistor TT, the output offset is reduced for output stabilization by varying the reset potential VR, as shown in FIG. 13(a).

In this case, the reset potential VR is set to be more negative than the ground potential (GND). Under this condition, when the second thin film transistor TR is turned on to carry out the reset operation, the potential on the drain electrode of the second thin film transistor TR (also the drain electrode of the first thin film transistor TT) drops to the reset potential VR, as shown in FIG. 13(a).

When the second thin film transistor TR is turned off, it drops by the feed-through-caused-voltage to reach the charge-storage start potential.

If the reset potential VR is equal to the ground potential GND, the charge-start potential is relatively high. Under this condition, the positive going offset of the potential at the drain electrode is large, and further the offset of the potential at the source electrode also goes greatly positive in the dark state.

Figure 13B:
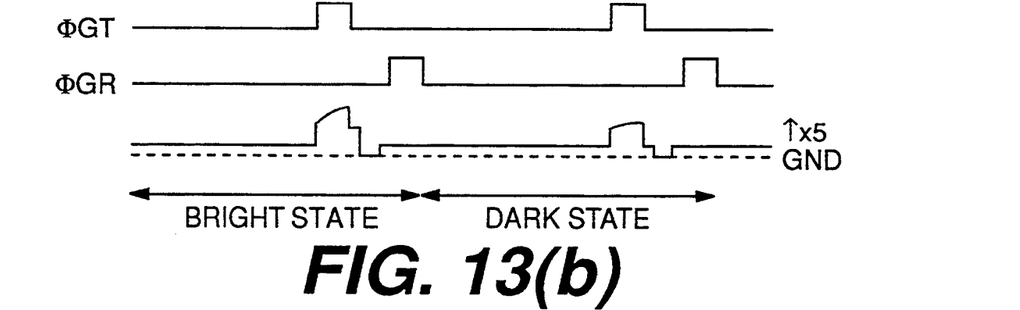

In this embodiment, since the ground potential > reset potential, the offset in the potential at the source electrode of the first thin film transistor TT is reduced, and the output signal in the dark state is reduced to zero (see FIG. 13(b)).

Figure 13C:
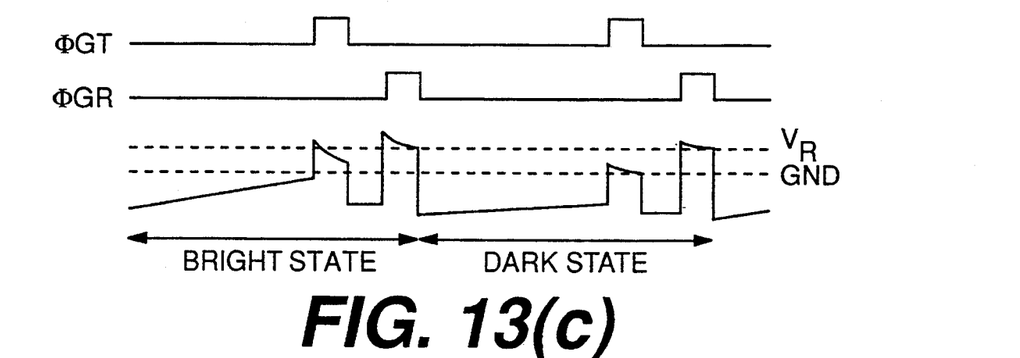

In a case where an alignment displacement takes place in the manufacturing process, and the feed-through-caused-voltage in the second or reset thin film transistor TR is larger than that in the first or charge-transfer thin film transistor TT, the output offset is reduced for output stabilization by varying the reset potential VR (FIG. 13(c)).

In this case, the reset potential VR is set to be more positive than the ground potential (GND). Under this condition, when the second thin film transistor TR is turned on to carry out the reset operation, the potential on the drain electrode of the second thin film transistor TR drops to the reset potential VR, which is higher than the ground potential (FIG. 13(c)).

When the second thin film transistor TR is turned off, it drops by the feed-through-caused-voltage to reach the charge-storage start potential.

If the reset potential VR is equal to the ground potential GND, the charge-start potential is relatively low. Under this condition, the negative going offset of the potential at the drain electrode is large, and further the offset of the potential at the source electrode also goes greatly negative in the dark state.

Figure 13D:
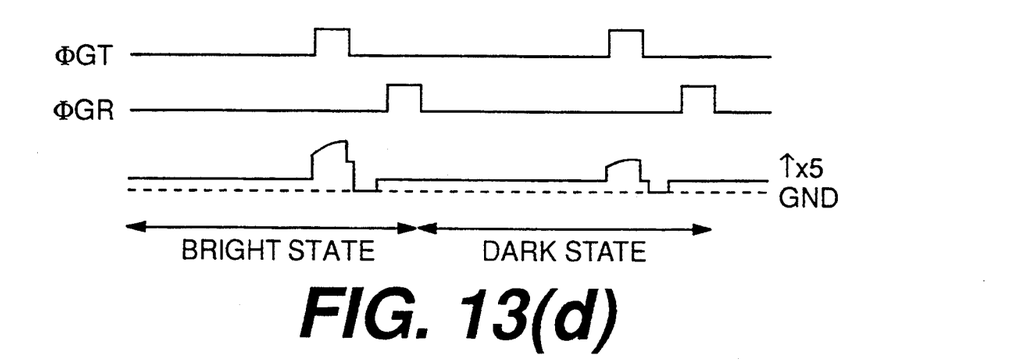

In this embodiment, since the ground potential > reset potential, the offset in the potential at the source electrode of the first thin film transistor TT is reduced, and the output signal in the dark state is reduced to zero (see FIG. 13(d)).

The reset potential VR may be previously set in design or in experiment. It may also be set means of a volume knob. In this case, the knob is turned so as to minimize the offset in the output signal.

In the image sensor of the second embodiment, the positive or negative going offset in the output image signal can be reduced through the adjustment of the charge storage start potential, which is carried out by varying the reset potential VR in the second or reset thin film transistor TR. Accordingly, the signal in the dark state can be rendered approximate to zero. Further, the variation in the output signal is reduced, leading to stabilization of the sensor output signal.

In an image sensor of the present invention, the amplitudes of the first pulse signal applied from the first gate pulse generator (16) to the first switching elements is different from the amplitude of the second pulse signal applied from the second gate pulse generator (16') to the second switching elements. Accordingly, the voltage caused by a feed-through voltage (referred to as a feed-through-caused-voltage) of the first or second switching element can be controlled, thereby adjusting a positive or negative going offset in the image output signal.

In another image sensor of the invention, the source electrodes of the first and second switching elements are aligned in the vertical scan direction, and the drain electrodes are also aligned in the same direction. With such a structure, when the image sensor involves an alignment displacement, both the switching elements have equal displacements. Accordingly, the feed-through-caused-voltages of the first and second switching elements have equal changes of voltage. As a result, the image output signal is little varied.

In still another image sensor of the invention, the source electrode overlaps with the gate electrode, and the drain electrode also overlaps with the gate electrode, thereby forming overlap capacitance, and the overlap capacitance of the second switching element is larger than that of the first switching element. For such an alignment displacement as to decrease the feed-through-caused-voltage in the second switching element, the overlap capacitance of the second switching element is large, thereby compensating for the decrease of the feed-through-caused-voltage. The positive going offset in the image output signal can be adjusted.

In a further image sensor of the invention, the reset potential applied to the source electrode of the second switching element is not equal to the ground potential. When the feed-through-caused-voltage in the second switching element is small, the reset potential is selected to be lower than the ground potential. When the feed-through-caused-voltage is large, the reset potential is selected to be higher than the ground potential. By the selection, the positive or negative going offset in the image output signal can be adjusted.

What is claimed is:

1. An image sensor comprising:
   photo sensing elements, having charge storage capability, for transducing received light into electrical quantities;
   first switching elements, each having a first source electrode, a first gate electrode and a first drain electrode with the first source and drain electrodes overlapping the first gate electrode to provide overlap capacity, for transferring charge stored in the photo sensing elements;
   second switching elements, each having a second source electrode, a second gate electrode and a second drain electrode with the second source and drain electrodes overlapping the second gate electrode to provide overlap capacity for resetting the photo sensing elements by removing the charge still left in the photo sensing elements after the charge transfer;

first gate pulse generator for generating a first pulse signal to be applied to the first switching elements; and a second gate pulse generator for generating a second pulse signal to be applied to the second switching elements, the amplitude of the second pulse signal being different from that of the first pulse signal based on the difference between the overlap capacity of the first switching elements and the overlap capacity of the second switching elements.

2. The image sensor according to claim 1, in which the first and second switching elements respectively have the first electrodes and the second electrodes layered in an overlapping manner and respective insulating layers interlayered between adjacent electrodes, thereby providing overlap capacitance for storing the charge.

3. The image sensor according to claim 1, in which the first pulse signal is larger in amplitude than the second pulse signal.

4. The image sensor according to claim 1, in which the first pulse signal is smaller in amplitude than the second pulse signal.

5. An image sensor comprising:

photo sensing elements, having charge storage capability, for transducing received light into electrical quantities;

first switching elements, each having a first source electrode, a first gate electrode and a first drain electrode with the first source and drain electrodes overlapping the first gate electrode to provide overlap capacity, for transferring charge stored in the photo sensing elements;

second switching elements, each having a second source electrode, a second gate electrode and a second drain electrode with the second source and drain electrodes overlapping the second gate electrode to provide overlap capacity for resetting the photo sensing elements by removing the charge still left in the photo sensing elements after the charge transfer;

the first and second switching elements having the respective first electrodes and second electrodes thereof arrayed such that the first and second source electrodes of the first and second switching elements being aligned in a vertical scan direction, and the first and second drain electrodes also being aligned in the vertical scan direction; and the amplitude of the second pulse signal being different from that of the first pulse signal based on difference between the overlap capacity of the first switching elements and the overlap capacity of the second switching elements.

6. An image sensor comprising:

photo sensing elements, having charge storage capability, for transducing received light into electrical quantities;

first switching elements, having first source, gate and drain electrodes and having charge storage capability, for transferring the charge stored in the photo sensing elements;

second switching elements, having second source, gate and drain electrodes and having charge storage capability, for resetting the photo sensing elements by removing the charge still left in the photo sensing elements after the charge transfer:

wherein, in each of the first and second switching elements, the source electrode overlaps with the gate electrode, and the drain electrode also overlaps with the gate electrode, thereby forming overlap capacitance, and the overlap capacitance of the second switching element is larger than that of the first switching element.

7. The image sensor according to claim 6, in which when the ratio of W/L of the first switching element is 9, the ratio of W/L of the second switching element is within 12 to 15 where W indicates the length of the gate electrode as viewed in a main horizontal scan direction, and L indicates the length of each of the source and the drain electrodes as viewed in a vertical scan direction.

8. An image sensor comprising:

photo sensing elements, having charge storage capability, for transducing received light into electrical quantities;

first switching elements, each having a first source electrode, a first gate electrode and a first drain electrode with the first source and drain electrodes overlapping the first gate electrode to provide overlapping capacity, for transferring charge stored in the photo sensing elements;

second switching elements, each having a second source electrode, a second gate electrode and a second drain electrode with the second source and drain electrodes overlapping the second gate electrode to provide overlapping capacity for resetting the photo sensing elements by removing the charge still left in the photo sensing elements after the charge transfer;

wherein a potential applied to the source electrodes of the second switching elements is not equal to the ground potential based on difference between the overlap capacity of the first switching elements and the overlap capacity of the second switching elements.

9. The image sensor according to claim 8, in which the potential applied to the second source electrodes of the second switching elements is lower than the ground potential.

10. The image sensor according to claim 8, in which the potential applied to the second source electrodes of the second switching elements is higher than the ground potential.

* * * * *